United States Patent
Zhu

(10) Patent No.: US 11,061,767 B2
(45) Date of Patent: Jul. 13, 2021

(54) POST-ECC CRC FOR DDR CRC RETRY PERFORMANCE IMPROVEMENT

(71) Applicant: Synopsys, Inc., Mountain View, CA (US)

(72) Inventor: Jun Zhu, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/736,815

(22) Filed: Jan. 8, 2020

(65) Prior Publication Data

US 2020/0218608 A1 Jul. 9, 2020

Related U.S. Application Data

(60) Provisional application No. 62/790,232, filed on Jan. 9, 2019.

(51) Int. Cl.
*G06F 11/10* (2006.01)
*G11C 11/4096* (2006.01)

(52) U.S. Cl.
CPC ...... *G06F 11/1068* (2013.01); *G06F 11/1004* (2013.01); *G11C 11/4096* (2013.01)

(58) Field of Classification Search
CPC ............. G06F 11/1068; G06F 11/1004; G11C 11/4096
USPC .......................... 714/764, 762, 763, 770, 765
See application file for complete search history.

(56) References Cited

U.S. PATENT DOCUMENTS

| | | | |
|---|---|---|---|
| 7,530,003 B2 | 5/2009 | Lee et al. | |
| 7,734,980 B2 | 6/2010 | Alexander et al. | |
| 8,140,936 B2 | 3/2012 | Gower et al. | |
| 8,601,205 B1* | 12/2013 | Menon | G11C 15/00 711/105 |
| 8,688,879 B2* | 4/2014 | Latta | G06F 13/4022 710/240 |
| 2006/0184749 A1* | 8/2006 | Guthrie | G06F 12/0831 711/146 |
| 2015/0279441 A1* | 10/2015 | Greenberg | G11C 11/406 365/49.1 |

OTHER PUBLICATIONS

Micheloni, R; Marelli, A; Commodaro, S Inside NAND Flash Memories, NAND overview: from memory to systems Jun. 23, 2010, p. 19-53 (Year: 2010).*

* cited by examiner

*Primary Examiner* — Fritz Alphonse
(74) *Attorney, Agent, or Firm* — Fenwick & West LLP

(57) ABSTRACT

A system and a method are disclosed for error correction during operations of a memory system. For example, during a read operation, the error correction includes a read retry determination to account for link errors that are detectable by cyclic redundancy check (CRC) but not correctable by error correction coding (ECC). Reducing the number of read retry operations performed may improve system performance by reducing the number of clock cycles spent on retry operations that could have otherwise been allocated for other system services (e.g., completing read and write operations). Additional CRC calculations and checks may be used to determine when to perform a retry in addition to existing CRC and ECC checks, reducing the number of potential retry operations and improving system performance.

20 Claims, 8 Drawing Sheets

```
If (Retry Decision is Not Retry) {
        // this is not Retry READ
        Retry_count = 0
}
If (CRC_chk0 == 0) {
        // no CRC error detected, no ERR1
        RD_CRC_Retry_en = Not Retry
        if (ECC_chk == 0) {
                // correctable ERR0 or no ERR0
                Return Data0_ECC as read data to System
        } else {
                // uncorrectable ERR0 detected
                Report uncorrectable Error to SOC
                Wait for SOC further instructions
        }
} else {
        // CRC_chk0 != 0, CRC error detected, ERR1 happens
        if (Retry_count >= Retry_threshold) {
                // Already Retried Retry_threshold times
                Report unstable DDR link Error to SOC,
                wait for SOC further instruction
        } else {
                // Keep retrying
                RD_CRC_Retry_en = Retry
                Retry_count++
                go back to beginning to Retry this READ
        }
}
```

FIG. 3

```
If (Retry Decision is Not Retry) {
        // this is not Retry READ
        Retry_count = 0
}
If (CRC_chk0 == 0) {
        // no CRC error detected, no ERR1
        RD_CRC_Retry_en = Not Retry
        if (ECC_chk == 0) {
                // correctable ERR0 or no ERR0
                Return Data0_ECC as read data to System
        } else {
                // uncorrectable ERR0 detected
                Report uncorrectable Error to SOC
                Wait for SOC further instructions
        }
} else {
        // CRC_chk0 != 0, CRC error detected, ERR1 happens
        if ((CRC_chk1 == 0) & (ECC_chk == 0)) {
                // no ERR0, and ERR1 is correctable by ECC
                RD_CRC_Retry_en = Not Retry
                Return Data0_ECC as read data to System
        } else {
                // (ERR1 occurs) & ( (ERR0 happens) | (ERR1 is beyond ECC capability) )
                if (Retry_count >= Retry_threshold) {
                        // Already Retried Retry_threshold times
                        Report unstable DDR link Error to SOC,
                        wait for SOC further instruction
                } else {
                        // Keep retrying
                        RD_CRC_Retry_en = Retry
                        Retry_count++
                        go back to beginning to Retry this READ
                }
        }
}
```

POST-ECC CRC FOR DDR CRC RETRY PERFORMANCE IMPROVEMENT

CROSS REFERENCE TO RELATED APPLICATIONS

This application claims the benefit of U.S. Provisional Application No. 62/790,232, filed Jan. 9, 2019, which is incorporated by reference in its entirety.

TECHNICAL FIELD

The disclosure generally relates to the field of error correction in memory cell operations and in particular to read retry operations in double data rate dynamic random access memory (DDR DRAM).

BACKGROUND

In DDR memory systems, errors can happen in memory cells or during data transmission on a link (e.g., during read or write operations). Two types of errors include storage errors and link errors. Storage errors are likely to be static and permanent. They may be caused by radiation (e.g., cosmic rays flipping bits of memory cells), DRAM cell aging, a short or open circuit on DRAM silicon, DRAM cell weakness in manufacturing, or retention variations. Link errors may be dynamic and transient. They can be caused by interference on a wide DDR parallel bus, a printed circuit board (PCB) short, or a PCB open.

Error correction coding (ECC) can be used for error detection and error correction. The correction and detection capability is determined by the ECC code. For example, an Enhanced-Hamming Code can provide a 1-bit error correction and 2-bit error detection for a 64-bit data payload. If a 2-bit error occurs, the ECC will consider it as an uncorrectable error. The ECC may detect an uncorrectable error and report it to the system-on-chip (SOC). However, if a 3-bit error occurs, the ECC may fail to detect the error in the data, causing the system to crash.

Cyclic redundancy check (CRC) is widely used for error detection and may have a stronger capability of error detection than ECC. For example, double data rate 5 (DDR5) CRC can provide a 100% error detection for several error types: random single bit errors, random double bit errors, random odd count errors, and random multi-bit errors within two adjacent transfers (e.g., two adjacent bits in CRC transfers). The wide range of errors that CRC can detect include the errors that ECC cannot correct (e.g., 2-bit and 3-bit errors). To this extent, having a CRC checker is significant to determine when even ECC correction cannot produce a corrected data packet. Accordingly, a combination of ECC and CRC is widely used in DDR systems, which run at very high speeds and have high reliability, accessibility, and serviceability (RAS) requirements.

BRIEF DESCRIPTION OF DRAWINGS

The disclosed embodiments have other advantages and features which will be more readily apparent from the detailed description, the appended claims, and the accompanying figures (or drawings). A brief introduction of the figures is below.

FIG. 3 shows illustrative pseudocode for a retry operation, according to at least one embodiment.

FIG. 5 shows illustrative pseudocode for a retry operation with Post-ECC CRC, according to at least one embodiment.

DETAILED DESCRIPTION

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Configuration Overview

One embodiment of a disclosed system, method and computer readable storage medium includes error correction in a DDR DRAM system using additional CRC to determine when to perform read retry operations.

Figure 1:
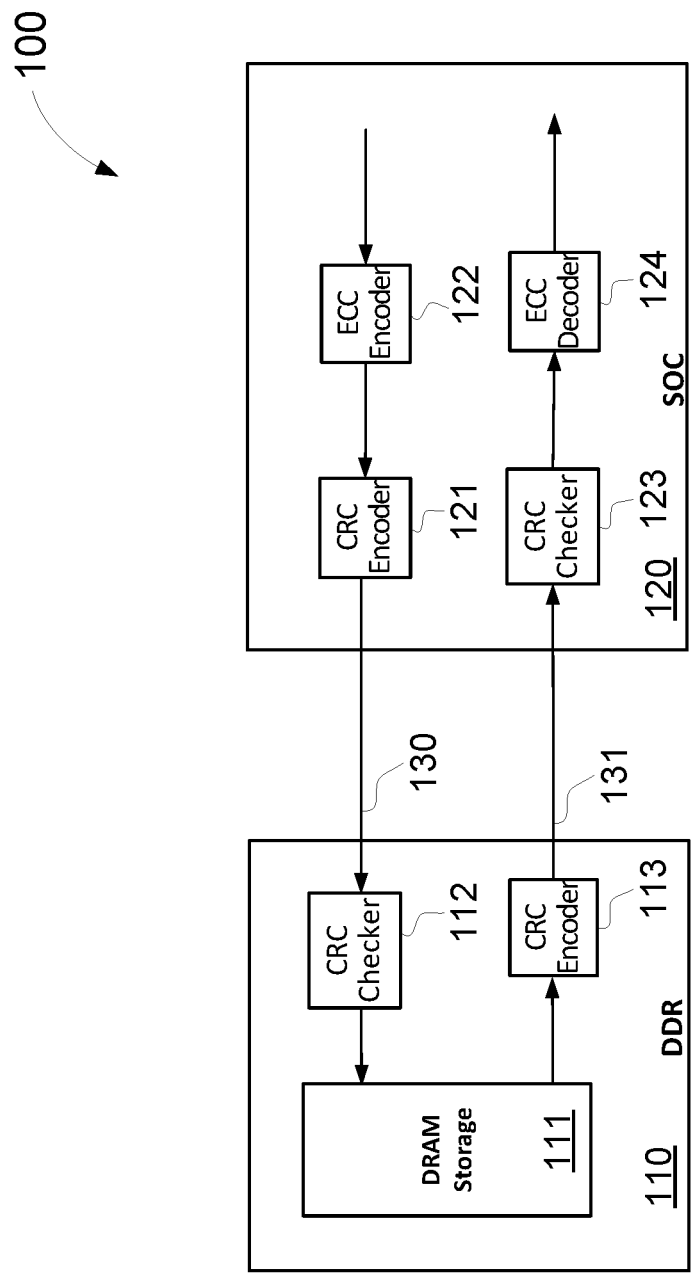
FIG. 1 is a block diagram depicting data flow of read and write operations in a DDR memory system, according to at least one embodiment.

FIG. 1 is a block diagram depicting data flow of read and write operations in DDR memory system 100. DDR memory system 100 includes DDR DRAM array 110 coupled to system-on-chip (SOC) 120. SOC 120 may write to DDR DRAM array 110 through link 130 of a parallel bus (e.g., a high speed parallel bus) that couples DDR DRAM array 110 to SOC 120. Link 131 of the parallel bus allows SOC 120 to read from DDR DRAM array 110. As referred to herein, "link" includes at least one or more paths (e.g., wires) in a parallel bus. Block diagrams depicted herein are not limited to the blocks shown and may include additional blocks connected to depicted blocks (e.g., additional ECC decoder and/or CRC calculation blocks).

SOC 120 includes CRC encoder 121, ECC encoder 122, CRC checker 123, and ECC decoder 124. An operation to write data to DDR DRAM array 110 includes encoding by ECC encoder 122 followed by encoding by CRC encoder 121. Although not depicted, another component of SOC 120 may transmit data to ECC encoder 122 for writing to memory. The encoded data from CRC encoder 121 is transmitted to DDR DRAM array 110 through link 130. DDR DRAM array 110 includes DRAM storage 111, CRC checker 112, and CRC encoder 113. The encoded data is input to CRC checker 112 to detect link errors. After determining whether link errors have occurred, ECC-encoded data may be stored in DRAM storage 111. From DRAM storage 111, data is input to CRC encoder 113 before being transmitted to SOC 120 over link 131 during a read operation. The encoded data is input to CRC checker 123. The CRC-corrected data is input to ECC decoder 124 to determine the original data input to ECC encoder 122. Although not depicted, another component of SOC 120 may receive the data from ECC decoder 124 to read from memory.

In some embodiments, a write operation flow begins with instructions (e.g., from SOC 120) to write data, Data0, into DDR. After ECC encoding by ECC encoder 122, the data packet becomes Data0+ECC0, where ECC0 is generated by ECC encoder 122 as ECC redundancy using Data0. After CRC encoding by CRC encoder 121, the data packet becomes (Data0+ECC0)+CRC0, where CRC0 is the CRC parity generated by CRC encoder 121 using Data0+ECC0. Data packet Data0+ECC0+CRC0 is transmitted over a link to DDR devices (e.g., over link 130 to DDR DRAM array 110). During transmission on link 130, a link error, ERR1, can happen that causes the data packet to change (e.g., a bit to flip). Consequently, DDR DRAM array 110 receives the data packet (Data0+ECC0+CRC0)+ERR1. CRC checker 112 uses this received data packet to generate a CRC value to compare with the received CRC (i.e., CRC0). The result of this comparison is indicative of whether or not an error occurred in the received data packet (e.g., if a link error occurred). If an error is detected, DDR DRAM array 110 can reject the received data to be stored in DRAM storage 111 and signal SOC 120 that a write CRC error has occurred. In some embodiments, SOC 120 retries the write operation until CRC checker 112 does not report a write CRC error (e.g., a link error). Where there is no ERR1 (e.g., ERR1 is '0'), Data0+ECC0, denoted now as Data0'+ECC0', is the resultant data packet. The data packet Data0'+ECC0' is stored into DRAM storage 111, completing the write operation flow.

In some embodiments, a read operation flow begins with instructions (e.g., from SOC 120) to read data from DDR DRAM array 110. For example, data packet Data0'+ECC0' stored in DRAM storage 111 can be read from memory. However, a storage error can occur, introducing an error, ERR0, to the stored data packet. Accounting for ERR0, the data packet is denoted as Data0"+ECC0" (i.e., (Data0+ECC0)+ERR0). This data packet is input to CRC encoder 121, which generates the CRC parity value, CRC0" DDR DRAM array 110 transmits the resulting data packet after CRC encoding, (Data0"+ECC0')+CRC0', to SOC 120 over link 131. During transmission over link 131, a link error, ERR1', may occur, causing SOC 120 to receive Data0"+ECC0"+CRC0"+ERR1'. CRC checker 123 uses this received data packet to generate a CRC value to compare with the received CRC (i.e., CRC0") to determine whether a link error over link 131 has occurred. However, even if CRC checker 123 detects ERR1', SOC 120 may not be able to determine whether both ERR0 and ERR1' occurred in the same data packet and the error count is beyond ECC decoder 124's capability to correct. For example, if both ERR0 and ERR1' occurred (i.e., causing a 2-bit error), CRC checker 123 may detect ERR1', but ECC decoder 124 will only be able to correct a 1-bit error. Consequently, an error remains in the data read from DDR DRAM array 110 and SOC 120 has not obtained the original data it wrote to memory. To ensure that the number of errors occurring can be detected and corrected by the combination of CRC decoder 123 and ECC decoder 124, SOC 120 retries the read operation until there is no read CRC error (e.g., ERR1') detected. ECC decoder 124 corrects any storage error (e.g., ERR0), outputting the original value of Data0 and completing the read operation flow.

Configuration Operation

Referring now to FIGS. 2-5, illustrated are read operation retry flows for different CRC check configurations. In some embodiments, a read operation retry mechanism is needed to resolve link errors unless there is a permanent link failure. The read operation retry helps an ECC decoder in the SOC receive a data packet with only a single-bit error that it has the capability to correct. For example, if a CRC checker detects a 2-bit error, an ECC decoder can only correct one bit and an error will remain in the resulting data packet. To obtain an error-corrected data packet, a read operation is retried until there is no link error (e.g., CRC error) or until a retry count reaches a threshold. A read operation retry consumes system resources to perform. As link speed increases, the likelihood of a link error also increases, and in turn, the retry rate increases. If the retry rate is too high, system performance deteriorates. For example, one retry may halt memory read services for hundreds or even thousands of clock cycles and increase read latency.

Figure 2:
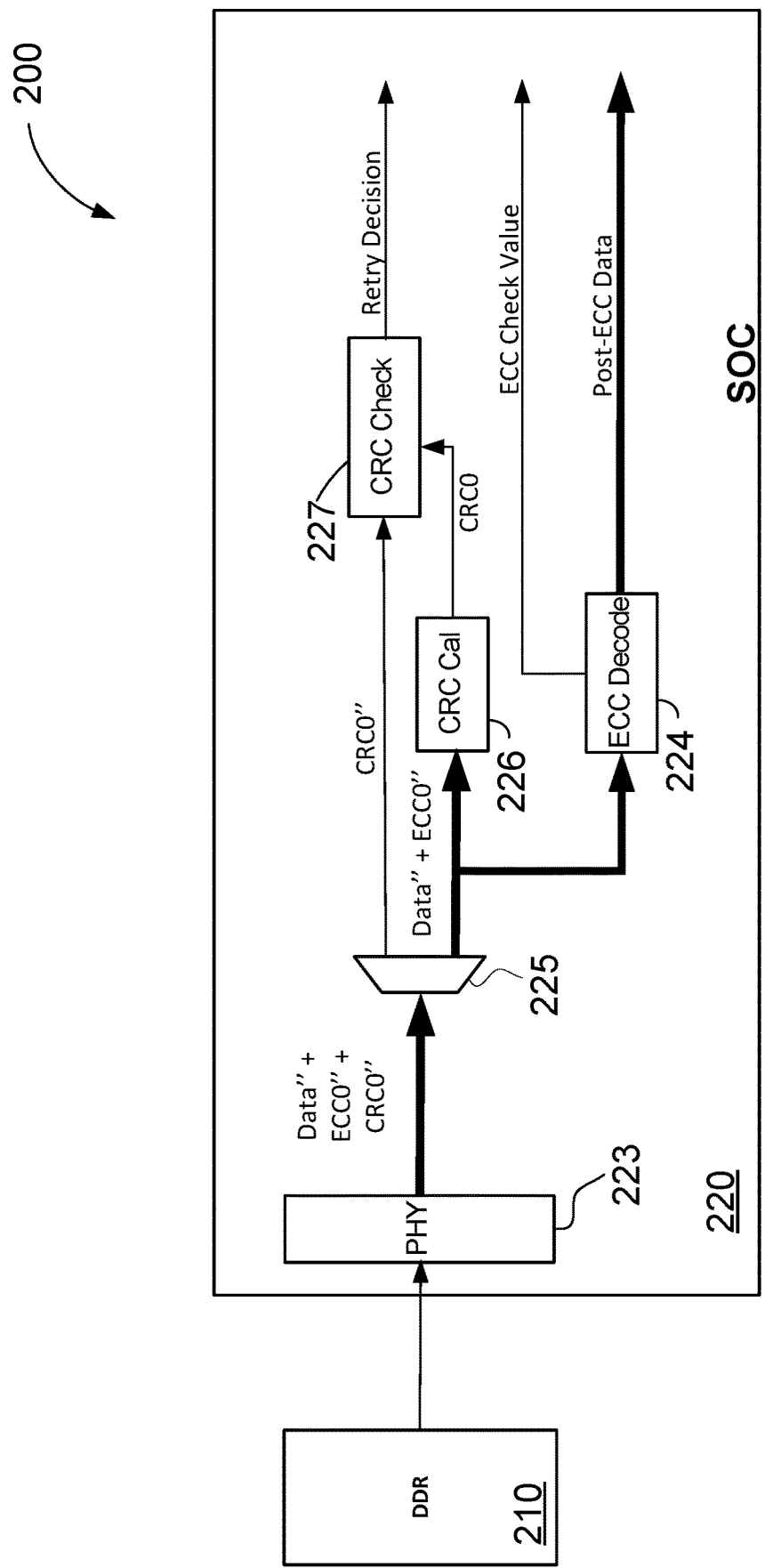
FIG. 2 is a block diagram depicting a read operation retry with one CRC value check, according to at least one embodiment.

FIG. 2 is a block diagram depicting a read operation retry with one CRC value check. In DDR DRAM system 200, DDR DRAM array 210 is coupled to SOC 220. Within SOC 220, a retry decision is determined based on a comparison of a received CRC value to a generated CRC value. SOC 220 includes PHY 223, demultiplexer (DEMUX) 225, CRC calculator CRC Cal 226, CRC checker CRC Check 227, and ECC decoder ECC Decode 224.

After receiving a data packet from DDR DRAM array 210, PHY 223 transmits the data packet to DEMUX 225. Without a link error, the data packet received by DEMUX 255 is (Data0"-ECC0")+CRC0". If a link error has occurred, error ERR1' is also received within the data packet. DEMUX 225 sends the data packet to CRC Cal 226 and separates CRC0" from the data packet to send to CRC Check 227. CRC Check 227 may compare received CRC values with generated CRC values. If the received CRC value, CRC0", is not equivalent to the CRC value generated by CRC Check 227, CRC0, then CRC Check 227 has detected a link error, ERR1'. When a link error is detected, the retry decision output by CRC Check 227 instructs SOC 220 to retry a read operation from DDR DRAM array 210. If ERR1' is not detected (i.e., CRC" and CRC0 are equivalent), the data packet is transmitted by DEMUX 225 to ECC Decode 224. If no uncorrectable error is detected in ECC decoding, the error-corrected data is transmitted as read data (e.g., transmitted to another component of SOC 220). Otherwise, an ECC check value will be asserted to indicate that there is an uncorrectable error in the read data packet. SOC 120 will be interrupted to handle the uncorrectable error.

In some embodiments, a retry threshold is used to limit the number of retries and minimize impacts to system performance. Although not shown, a separate component within SOC 220 may be configured to determine whether a read CRC retry is needed. For example, a DDR Memory Controller within SOC 220 may calculate the CRC, determine if an error has occurred, and control the procedure of a retry operation. FIG. 3 shows a non-limiting example of pseudocode implemented for this retry operation. In some embodiments, a retry counter that is incremented with each retry attempt may be initialized based on a value of a retry enable flag. CRC0" and CRC0 may be compared to determine whether the CRC values match and if a link error has occurred. For example, a link error is detected if the CRC values do not match. If a link error has not been detected and ECC decode 224 has determined that there is either a correctable storage error or no storage error in the received data, ECC decode 424 may return the received data as read data. In some embodiments, if a link error is detected, the retry enable flag may be disabled. If a link error has not been detected and ECC decode 224 has determined that there is an uncorrectable storage error, the uncorrectable error may be reported and further instruction may be received from SOC 220. If a link error has been detected and if the retry counter has not exceeded a retry threshold, the read operation may be retried (e.g., the retry enable flag is enabled) and the retry counter may be incremented. If a link error has been detected and the retry counter has exceeded or met the threshold, an unstable link error to SOC 220 may be reported and further instructions may be received from SOC 220.

Figure 4:
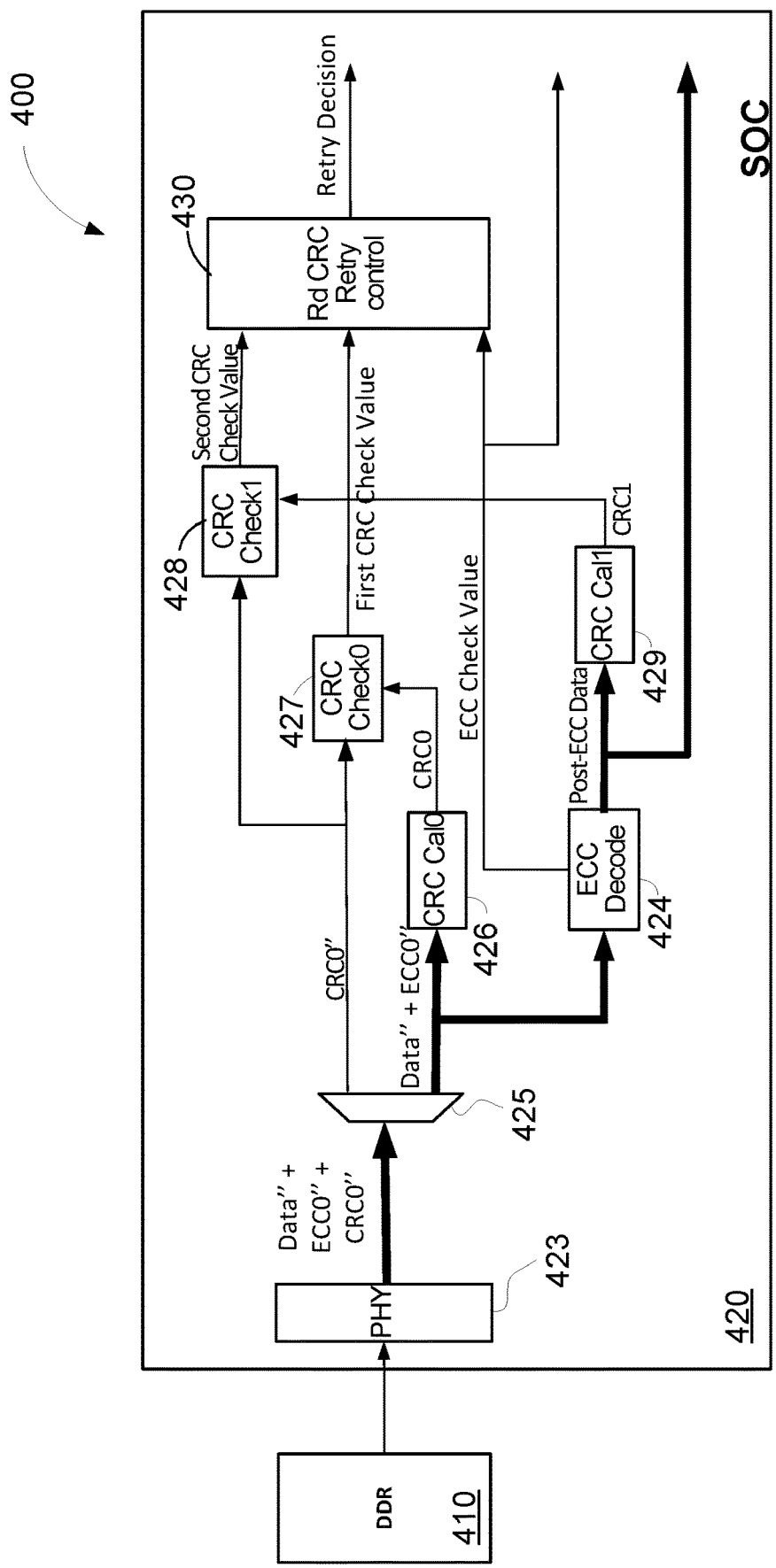
FIG. 4 is a block diagram depicting a read operation retry with two CRC value checks.

In some embodiments, the number of retries may be decreased by an additional CRC calculation. FIG. 4 is a block diagram depicting a read operation retry with two CRC value checks. In DDR DRAM system 400, DDR DRAM array 410 is coupled to SOC 420. Within SOC 420, a retry decision is determined based on multiple CRC value comparisons. SOC 420 includes PHY 423, DEMUX 425, CRC calculator CRC Cal0 426, CRC checker CRC Check0 427, and ECC decoder ECC Decode 424 that function similar to like reference numerals in FIG. 2 (e.g., PHY 223 and PHY 423 both receive a data packet from a DDR DRAM array and transmit the data packet to a DEMUX). Additional components within SOC 420 as compared to SOC 220 include an additional CRC calculator CRC Cal1 429, CRC checker CRC Check1 428, and Read CRC Retry Control 430. An additional CRC check value based on CRC Cal1 429's output is used to determine whether to retry a read operation in addition to the ECC and CRC check values obtainable by the configuration in DDR DRAM system 200.

A post-ECC CRC operation within SOC 420 includes additional components CRC Cal1 429, CRC Check1 428 and Read CRC Retry Control 430. CRC Cal1 429 calculates a CRC using post-ECC data from ECC Decode 424. CRC Check1 428 compares CRC Cal1 429's CRC to the received CRC distributed by DEMUX 425. The result of the comparison is a CRC check value that is used by Read CRC Retry Control 430 to determine whether to retry the read operation. This determination is further based on the CRC check value from CRC Check0 427 and the ECC check value from ECC Decode 424. This additional check performed by Read CRC Retry Control 430 to determine whether a retry operation is needed may limit the number of retries.

In some embodiments, a retry threshold is used to further limit the number of retries and minimize impacts to system performance. Read CRC Retry Control 430 or, although not shown, a separate component within SOC 420 may be configured to determine whether a read CRC retry is needed. For example, a DDR Memory Controller within SOC 420 may control the procedure of a retry operation. FIG. 5 shows a non-limiting example of pseudocode implemented for this retry operation with Post-ECC CRC, where pseudocode block 500 reflects the Post-ECC CRC components added to the block diagram of FIG. 2 to result in FIG. 4's block diagram. In some embodiments, Read CRC Retry Control 430 initializes a retry counter that will be incremented with each retry attempt. The retry counter may be initialized based on a value of a retry enable flag. CRC check 427 determines whether CRC0" and CRC0 match (e.g., whether a link error has been detected). If a link error has not been detected and ECC decode 424 has determined that there is either a correctable storage error or no storage error in the received data, ECC decode 424 may return the received data as read data. If a link error has not been detected and ECC decode 224 has determined that there is an uncorrectable storage error, Read CRC Retry Control 430 may report the uncorrectable error and await further instruction from SOC 420. In some embodiments, if a link error is detected, the retry enable flag may be disabled. If a link error has been detected and if the retry counter has not exceeded a retry threshold, Read CRC Retry Control 430 may retry the read operation and increment the retry counter. If a link error has been detected at CRC check 427, the additional CRC check value and the ECC check value may be used to determine whether the post-ECC data is suitable for use as read data. If a link error has been detected before ECC decoding at ECC Decode 424, there is no storage error, and CRC check 428 does not detect a link error (e.g., verifying that the ECC decoding has corrected the link error), ECC decode 424 may return the received data as read data and the retry enable flag may be disabled. If the post-ECC data contains uncorrectable storage and link errors and the retry counter has not exceeded or met the threshold, Read CRC Retry Control 430 may retry the read operation, enable the retry enable flag, and increment the retry counter. If the post-ECC data contains uncorrectable storage and link errors and the retry counter has exceeded or met the threshold, Read CRC Retry Control 430 may report an unstable link error to SOC 420 and wait for further instruction from SOC 420.

Electronic Design Automation System and Workflow

Figure 6:
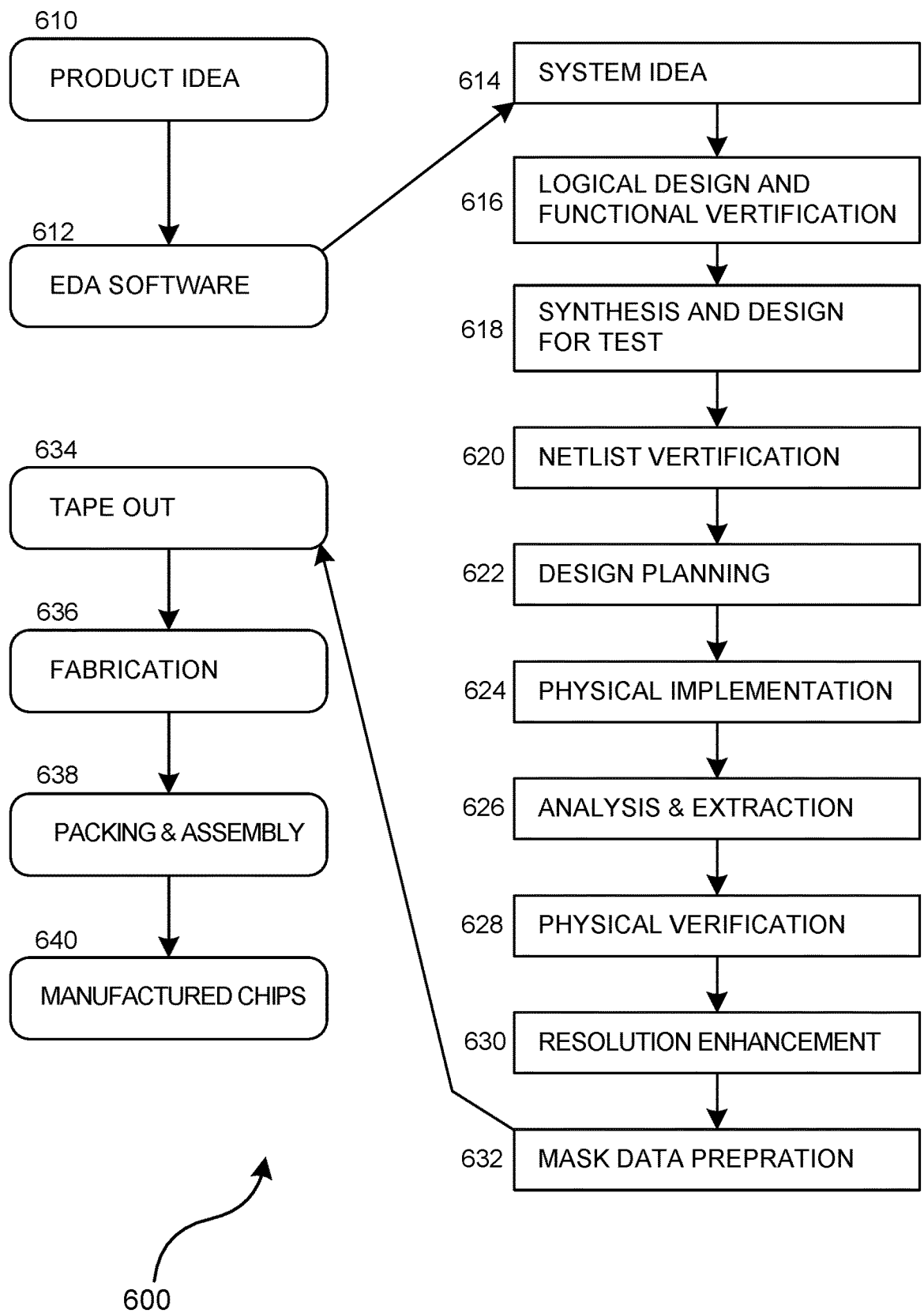
FIG. 6 depicts a flowchart of various operations in the design and fabrication of an integrated circuit, according to at least one embodiment.

FIG. 6 illustrates various processes 600 performed in the design, verification and fabrication of an item of manufacture such as an integrated circuit using software tools with a computer, and possibly special hardware-assisted tools, to transform and verify design data and instructions that represent the integrated circuit. The term 'EDA' signifies the term 'Electronic Design Automation.' These processes start with the creation of a product idea 610 with information supplied by a designer, information which is transformed during a process to create an item of manufacture (referred to herein as a design or device) that uses an EDA software tool 612, which may also be signified herein as EDA software, as a design tool, or a verification tool. When the design is finalized, it can be taped-out 634, which typically is when artwork (e.g., geometric patterns) for the integrated circuit is sent to a fabrication facility to manufacture the mask set, which is then used to manufacture the integrated circuit. After tape-out, a semiconductor die is fabricated 636 and packaging and assembly processes 638 are performed, which result in the finished integrated circuit 640 which may also be signified herein as a circuit, device, component, chip or SoC (System on Chip).

Items of manufacture, for example, a circuit or system are used in commerce at a variety of levels of abstraction ranging from low-level transistor layouts to high-level description languages. Most designers start at high-level of abstraction to design their circuits and systems, using a hardware description language ('HDL') such as VHDL, Verilog, SystemVerilog, SystemC, MyHDL or OpenVera. The high-level HDL is easier for developers to comprehend, especially for a vast system, and may describe highly complex concepts that are difficult to grasp using a lower level of abstraction. The HDL description may be converted into other levels of abstraction as is helpful to the developers. For example, a high-level description may be converted to a logic-level register transfer level ('RTL') description, a gate-level description, a layout-level description, or a mask-level description. Each lower abstraction level introduces more detail into the design description. The lower-levels of abstraction may be generated automatically by computer, derived from a design library, or created by another design automation technique. An example of a specification language at a lower level of abstraction is SPICE, which is much used for detailed descriptions of analog-based circuits.

A design process that uses an EDA software tool 612 includes processes 614 to 632, which are described below. This design flow description is for illustration purposes only and is not meant to limit the present disclosure. For example, an actual integrated circuit design may require a designer to perform the design operations in a different sequence than the sequence described herein.

During system design 614, a designer describes the functionality to be manufactured. The designer can also perform what-if planning to refine the functionality and to check costs, etc. Hardware-software architecture partitioning can occur at this stage.

During logic design and functional verification 616, modules in the circuit are specified in one or more hardware description languages, or HDLs, and the design in HDL is checked for functional accuracy, that is, to match the requirements of the specification of the circuit or system being designed to ensure that the design produces the correct outputs. Exemplary HDL languages are Verilog, VHDL and SystemC. Functional verification is typically done by using software-based simulators and other tools such as testbench generators, static HDL checking tools and formal verification tools. In some situations, special hardware referred to as 'emulators' or 'prototyping systems' are used to speed up the functional verification.

During synthesis and design for test 618, HDL code is translated to a netlist. This netlist can be optimized for the target technology. Additionally, tests can be designed and implemented to check the finished integrated circuit. During netlist verification 620, the netlist is checked for compliance with timing constraints and for correspondence with the HDL code.

During design planning 622, an overall floor plan for the integrated circuit is constructed and analyzed for timing and top-level routing. During layout implementation 624, the physical placement (positioning of circuit elements such as transistors or capacitors) and routing (connection of the same by a plurality of conductors) occurs, as can selection of library cells to perform specific logic functions. During analysis and extraction 626, the circuit function is verified at the layout level, which permits refinement of the layout design.

During physical verification 628, the layout design is checked to ensure correctness for manufacturing constraints such as DRC constraints, electrical constraints, lithographic constraints, and circuitry function matching the HDL design specification. For example, layout in the design corresponding to the DDR DRAM and the SOC that reads from the DDR DRAM arrays may be checked for functional accuracy to verify read retry operations are not performed for single-bit link errors. In one embodiment, the layout of the Read CRC Retry Control of a SOC is checked for functional accuracy to verify proper retry decisions are being determined for the storage errors, link errors, or the absence of either error.

During resolution enhancement 630, geometric manipulations of the layout are performed to improve manufacturability of the design. During tape-out, data is created to be used (after lithographic enhancements are applied if appropriate) for production of lithography masks. During mask-data preparation 632, the 'tape-out' data is used to produce lithography masks that are used to produce finished integrated circuits.

For all of the above mentioned integrated circuit design tools, similar tools from other EDA vendors, such as Cadence, Siemens, other corporate entities or various non-commercial tools from universities, or open source repositories, can be used as an alternative. Embodiments of the present disclosure can be used during one or more of the above-described stages. Specifically, some embodiments of the present disclosure can be used in EDA software 612.

A storage subsystem is preferably used to store the programs and data structures that provide the functionality of some or all of the EDA tools described herein, and tools applied for development of cells for the library and for physical and logical design using the library. These programs and data structures are generally executed by one or more processors in a manner known to those of ordinary skill in the art.

General Computer System Applications

Figure 7A:
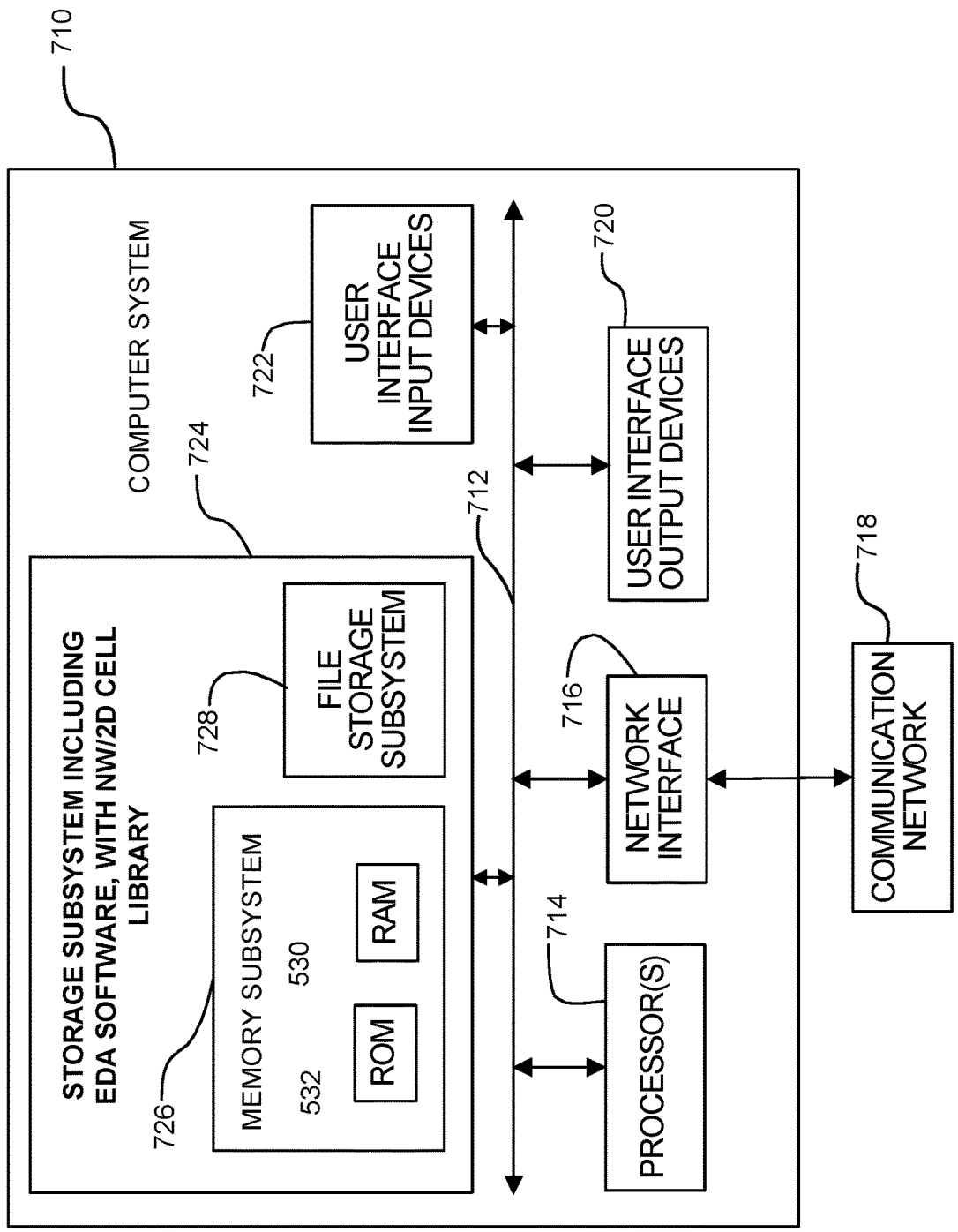
FIGS. 7A-7C depict block diagrams of a computer system suitable for use with embodiments of the technology, as well as circuit design and circuit embodiments of the technology, according to at least one embodiment.
Figures 7B, 7C:
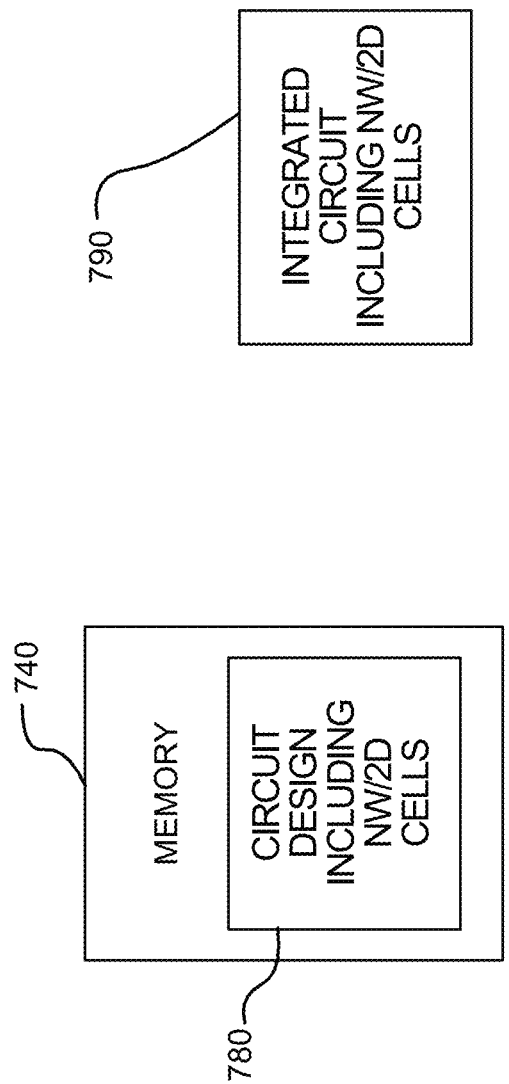

FIGS. 7A, 7B and 7C are simplified block diagrams of a computer system suitable for use with embodiments of the technology, as well as circuit design and circuit embodiments of the technology. In FIG. 7A, computer system 710 typically includes at least one computer or processor 714 which communicates with a number of peripheral devices via bus subsystem 712. Typically, the computer can include, or the processor can be, any of a microprocessor, graphics processing unit, or digital signal processor, and their electronic processing equivalents, such as an Application Specific Integrated Circuit ('ASIC') or Field Programmable Gate Array ('FPGA'). The terms 'processor' and 'computer' are further defined below. These peripheral devices may include a storage subsystem 724, comprising a memory subsystem 726 and a file storage subsystem 728, user interface input devices 722, user interface output devices 720, and a network interface subsystem 716. The input and output devices allow user interaction with computer system 710.

The computer system may be a server computer, a client computer, a workstation, a mainframe, a personal computer (PC), a tablet PC, a set-top box (STB), a personal digital assistant (PDA), a cellular telephone, a smartphone, a web appliance, a rack-mounted 'blade', a kiosk, a television, a game station, a network router, switch or bridge, or any data processing machine capable of executing instructions (sequential or otherwise) that specify actions to be taken by that machine.

The computer system typically includes an operating system, such as Microsoft's Windows, Sun Microsystems's Solaris, Apple Computer's MacOS, Linux or Unix. The computer system also typically can include a Basic Input/Output System (BIOS) and processor firmware. The operating system, BIOS and firmware are used by the processor to control subsystems and interfaces connected to the processor.

Innovations, embodiments and/or examples of the claimed inventions are neither limited to conventional computer applications nor the programmable apparatus that run them. For example, the innovations, embodiments and/or examples of what is claimed can include an optical computer, quantum computer, analog computer, or the like. The computer system may be a multi-processor or multi-core system and may use or be implemented in a distributed or remote system. The term 'processor' here is used in the broadest sense to include a singular processor and multi-core or multi-processor arrays, including graphic processing units, digital signal processors, digital processors and combinations of these devices. Further, while only a single computer system or a single machine may be illustrated, the use of a singular form of such terms shall also signify any collection of computer systems or machines that individually or jointly execute instructions to perform any one or more of the sets of instructions discussed herein. Due to the ever-changing nature of computers and networks, the description of computer system 710 depicted in FIG. 7A is intended only as one example for purposes of illustrating the preferred embodiments. Many other configurations of computer system 710 are possible having more or less components than the computer system depicted in FIG. 7A.

Network interface subsystem 716 provides an interface to outside networks, including an interface to communication network 718, and is coupled via communication network 718 to corresponding interface devices in other computer systems or machines. Communication network 718 may comprise many interconnected computer systems, machines and communication links. These communication links may be wireline links, optical links, wireless links, or any other devices for communication of information. Communication network 718 can be any suitable computer network, for example a wide area network such as the Internet, and/or a local area network such as Ethernet. The communication network can be wired and/or wireless, and the communication network can use encryption and decryption methods, such as is available with a virtual private network. The communication network uses one or more communications interfaces, which can receive data from, and transmit data to, other systems. Embodiments of communications interfaces typically include an Ethernet card, a modem (e.g., telephone, satellite, cable, or ISDN), (asynchronous) digital subscriber line (DSL) unit, Firewire interface, USB interface, and the like. One or more communications protocols can be used, such as HTTP, TCP/IP, RTP/RTSP, IPX and/or UDP.

User interface input devices 722 may include an alphanumeric keyboard, a keypad, pointing devices such as a mouse, trackball, touchpad, stylus, or graphics tablet, a scanner, a touchscreen incorporated into the display, audio input devices such as voice recognition systems or microphones, eye-gaze recognition, brainwave pattern recognition, and other types of input devices. Such devices can be connected by wire or wirelessly to a computer system. In general, use of the term 'input device' is intended to include all possible types of devices and ways to input information into computer system 710 or onto communication network 718. User interface input devices typically allow a user to select objects, icons, text and the like that appear on some types of user interface output devices, for example, a display subsystem.

User interface output devices 720 may include a display subsystem, a printer, a fax machine, or non-visual displays such as audio output devices. The display subsystem may include a cathode ray tube (CRT), a flat-panel device such as a liquid crystal display (LCD), a projection device, or some other device for creating a visible image such as a virtual reality system. The display subsystem may also provide non-visual display such as via audio output or tactile output (e.g., vibrations) devices. In general, use of the term 'output device' is intended to include all possible types of devices and ways to output information from computer system 710 to the user or to another machine or computer system.

Memory subsystem 726 typically includes a number of memories including a main random-access memory ('RAM') 730 (or other volatile storage device) for storage of instructions and data during program execution and a read only memory ('ROM') 732 in which fixed instructions are stored. File storage subsystem 728 provides persistent storage for program and data files, and may include a hard disk drive, a floppy disk drive along with associated removable media, a CD-ROM drive, an optical drive, a flash memory, or removable media cartridges. The databases and modules implementing the functionality of certain embodiments may be stored by file storage subsystem 728.

Bus subsystem 712 provides a device for letting the various components and subsystems of computer system 710 communicate with each other as intended. Although bus subsystem 712 is shown schematically as a single bus, alternative embodiments of the bus subsystem may use multiple busses. For example, RAM-based main memory can communicate directly with file storage systems using Direct Memory Access ('DMA') systems.

FIG. 7B depicts a memory 740 such as a non-transitory, computer readable data and information storage medium associated with file storage subsystem 728, and/or with network interface subsystem 716, and can include a data structure specifying a circuit design. The memory 740 can be a hard disk, a floppy disk, a CD-ROM, an optical medium, removable media cartridge, or other medium that stores computer readable data in a volatile or non-volatile form. Software read into a computer from such a memory can be converted at a selected instance in time from a tangible form to a transmission signal that is propagated through a medium (such as a network, connector, wire, or trace as an electrical pulse or a medium such as space or an atmosphere as electromagnetic radiation with wavelengths in the electromagnetic spectrum longer than infrared light).

FIG. 7C signifies an integrated circuit 790 created with the described technology that includes one or more cells selected, for example, from a cell library.

Additional Configuration Considerations

Example benefits and advantages of the disclosed configurations include improved DDR DRAM system performance. For the two types of errors in a DDR DRAM system, storage and link errors, the higher clock frequency causes an increased link error rate. While a DDR read retry may be performed when any link error is detected, too many retries decreases DDR DRAM system performance. A majority of link errors may be single-bit errors. When post-ECC CRC is introduced, a retry operation is not needed for single-bit link errors. Consequently, post-ECC CRC reduces the number of retry operations performed and improves DDR DRAM system performance. Although the Post-ECC CRC check described herein references a DDR DRAM system, the post-ECC CRC check may be applied to additional storage or communication systems. For example, a storage or communication system that has ECC as an inner correction code and CRC as an outer correction code (e.g., first encoding the data with ECC and then with CRC). In such systems, if a CRC error occurs, a retry is required before performing the ECC and the implementation of a post-ECC CRC may reduce the number of retry operations performed.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of components, modules, or mechanisms. Modules may constitute either software modules (e.g., code embodied on a machine-readable medium or in a transmission signal) or hardware modules. A hardware module is tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired), or temporarily configured (e.g., programmed) to operate in a certain manner or to perform certain operations described herein. As used herein, "hardware-implemented module" refers to a hardware module. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple of such hardware modules exist contemporaneously, communications may be achieved through signal transmission (e.g., over appropriate circuits and buses) that connect the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or processors or processor-implemented hardware modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., application program interfaces (APIs)).

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "algorithm" is a self-consistent sequence of operations or similar processing leading to a desired result. In this context, algorithms and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. It should be understood that these terms are not intended as synonyms for each other. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Upon reading this disclosure, those of skill in the art will appreciate still additional alternative structural and functional designs for a system and a process for error correction in DDR DRAM systems that includes post-ECC CRC to reduce the amount of retry operations performed to read data from memory through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A method for a read operation in an integrated circuit, the method comprising:

receiving, over a double data rate dynamic random access memory (DDR DRAM) bus, data and a first cyclic redundancy check (CRC) value from DDR DRAM storage;

calculating, based on the received data, a second CRC value;

comparing the first CRC value with the second CRC value to generate a first CRC check value, wherein the first CRC check value is indicative of whether a first CRC error has occurred in the received data;

decoding the received data using an error correction code (ECC) decoder;

generating, based on the received data, an ECC check value;

calculating, based on the decoded data, a third CRC value;

comparing the first CRC value with the third CRC value to generate a second CRC check value, wherein the second CRC check value is indicative of whether a second CRC error has occurred in the decoded data; and determining, based on the first CRC check value, the ECC check value, and the second CRC check value, whether to retry a DDR DRAM read operation to read the data.

2. The method of claim 1, further comprising:

performing, in response to determining to retry the DDR DRAM read operation, the DDR DRAM read operation to read the data; and providing, in response to determining not to retry the DDR DRAM read operation, the decoded data as read data, wherein the read data comprises at least one of a correctable error or an absence of error.

3. The method of claim 1, further comprising:

initializing a retry counter in response to determining that a retry of the DDR DRAM read operation has not occurred; and incrementing the retry counter in response to determining to retry the DDR DRAM read operation.

4. The method of claim 3, wherein determining whether to retry the DDR DRAM read operation to read the data is further based on comparing the retry counter to a retry threshold.

5. The method of claim 4, further comprising in response to determining that the retry counter has exceeded the retry threshold, reporting a link error.

6. The method of claim 1, further comprising:

determining, based on the first CRC check value, that the first CRC error has occurred in the received data, wherein the first CRC error comprises a link error; and reporting the link error.

7. The method of claim 6, wherein the link error is caused by interference on a wide DDR parallel bus, a short circuit, or an open circuit.

8. The method of claim 1, further comprising determining, based the ECC check value, that a storage error has occurred in the received data.

9. The method of claim 1, wherein the first CRC error is equivalent to the second CRC error.

10. The method of claim 1, further comprising:

encoding the data to be provided to the DDR DRAM storage;

generating, based on the encoded data, a fourth CRC value; and determining, based on the fourth CRC value, whether to retry a DDR DRAM write operation to provide the data to the DDR DRAM storage.

11. A non-transitory computer readable storage medium comprising a stored electronic representation of an integrated circuit, the representation comprising:
  a memory array for storing a plurality of bits, the memory array comprising a double data rate dynamic random access memory (DDR DRAM) storage; and
  a controller coupled to the memory array, the controller comprising:
    a physical layer (PHY) block configured to receive, over a DDR DRAM bus, the plurality of bits and a first cyclic redundancy check (CRC) value from the DDR DRAM storage;
    a first CRC calculator configured to calculate, based on the received plurality of bits, a second CRC value;
    a first CRC evaluator configured to compare the first CRC value with the second CRC value to generate a first CRC check value, wherein the first CRC check value is indicative of whether a first CRC error has occurred in the received plurality of bits;
    an error correction code (ECC) decoder configured to:
      decode the received plurality of bits; and
      generate, based on the received plurality of bits, an ECC check value;
    a second CRC calculator configured to calculate, based on the decoded plurality of bits, a third CRC value;
    a second CRC evaluator configured to compare the first CRC value with the third CRC value to generate a second CRC check value, wherein the second CRC check value is indicative of whether a second CRC error has occurred in the decoded plurality of bits; and
    a read retry module configured to:
      determine, based on the first CRC check value, the ECC check value, and the second CRC check value, whether to retry a DDR DRAM read operation to read the plurality of bits.

12. The non-transitory computer readable storage medium of claim 11, wherein the read retry module is further configured to:
  perform, in response to determining to retry the DDR DRAM read operation, the DDR DRAM read operation to read the plurality of bits; and
  provide, in response to determining not to retry the DDR DRAM read operation, the decoded plurality of bits as read data, wherein the read data comprises at least one of a correctable error or an absence of error.

13. The non-transitory computer readable storage medium of claim 11, wherein the read retry module is further configured to:
  initialize a retry counter in response to determining that a retry of the DDR DRAM read operation has not occurred; and
  increment the retry counter in response to determining to retry the DDR DRAM read operation.

14. The non-transitory computer readable storage medium of claim 13, wherein the read retry module is configured to determine whether to retry the DDR DRAM read operation to read the data further based on comparing the retry counter to a retry threshold.

15. The non-transitory computer readable storage medium of claim 14, wherein the read retry module is further configured to, in response to determining that the retry counter has exceeded the retry threshold, report a link error.

16. The non-transitory computer readable storage medium of claim 11, wherein the read retry module is further configured to:
  determine, based on the first CRC check value, that the first CRC error has occurred in the received data, wherein the first CRC error comprises a link error; and
  report the link error.

17. The non-transitory computer readable storage medium of claim 16, wherein the link error is caused by interference on a wide DDR parallel bus, a short circuit, or an open circuit.

18. The non-transitory computer readable storage medium of claim 11, wherein the read retry module is further configured to determine, based the ECC check value, that a storage error has occurred in the received data.

19. The non-transitory computer readable storage medium of claim 11, wherein the first CRC error is equivalent to the second CRC error.

20. The non-transitory computer readable storage medium of claim 11,
  wherein the controller further comprises:
  an ECC encoder configured to:
    encoding the data to be provided to the DDR DRAM storage; and
  a CRC encoder configured to:
    generating, based on the encoded data, a fourth CRC value; and
  wherein the memory array further comprises a third CRC evaluator configured to determine, based on the fourth CRC value, whether to retry a DDR DRAM write operation to provide the data to the DDR DRAM storage.

* * * * *